US012352867B2

(12) United States Patent
Krishnan et al.

(10) Patent No.: US 12,352,867 B2
(45) Date of Patent: Jul. 8, 2025

(54) SENSOR ASSEMBLY

(71) Applicant: Ford Global Technologies, LLC, Dearborn, MI (US)

(72) Inventors: Venkatesh Krishnan, Canton, MI (US); Michael Robertson, Jr., Garden City, MI (US); Rashaun Phinisee, Ypsilanti, MI (US); Tyler D. Hamilton, Farmington, MI (US); Alexander Petniunas, Canton, MI (US); Subba Reddy Boggu, Prakasam Dist (IN)

(73) Assignee: Ford Global Technologies, LLC, Dearborn, MI (US)

( * ) Notice: Subject to any disclaimer, the term of this patent is extended or adjusted under 35 U.S.C. 154(b) by 442 days.

(21) Appl. No.: 18/052,218

(22) Filed: Nov. 3, 2022

(65) Prior Publication Data

US 2024/0151854 A1 May 9, 2024

(51) Int. Cl.
*G01S 17/931* (2020.01)
*B60R 11/00* (2006.01)
*G01D 11/24* (2006.01)
*G01D 11/26* (2006.01)
*H05K 7/20* (2006.01)

(52) U.S. Cl.
CPC ............ *G01S 17/931* (2020.01); *B60R 11/00* (2013.01); *G01D 11/245* (2013.01); *H05K 7/2039* (2013.01); *B60R 2011/004* (2013.01); *G01D 11/26* (2013.01)

(58) Field of Classification Search
CPC ............... G01S 7/4813; G01S 17/931; G01S 2007/4977; G01S 2013/93273; G01S 7/027; G01S 7/481; G01S 13/931; B60R 11/04; B60R 11/00; B60H 2001/003; G01D 11/24; G01D 11/245
See application file for complete search history.

(56) References Cited

U.S. PATENT DOCUMENTS

| 10,220,817 | B2 | 3/2019 | Rice |
| 10,359,303 | B1 * | 7/2019 | Krishnan ............... B60R 11/04 |
| 10,578,716 | B1 | 3/2020 | Hu et al. |
| 10,589,724 | B2 | 3/2020 | Krishnan et al. |
| 10,744,979 | B2 | 8/2020 | Schmidt et al. |

(Continued)

FOREIGN PATENT DOCUMENTS

| WO | 2018017395 A1 | 1/2018 |
| WO | WO-2019241510 A1 * | 12/2019 ............ B60R 11/04 |
| WO | 2020260075 A1 | 12/2020 |

*Primary Examiner* — Olumide Ajibade Akonai
(74) *Attorney, Agent, or Firm* — Frank A. Mackenzie; Brooks Kushman P.C.

(57) ABSTRACT

A sensor assembly includes a housing, a sensor unit attached to the housing, and a gutter fixed relative to the housing. The sensor unit includes a cylindrical shell defining a vertical axis. The cylindrical shell extends above a highest point of the housing. The cylindrical shell is rotatable around the axis relative to the housing. The cylindrical shell includes a lower edge and extending upward along the axis from the lower edge. The gutter is elongated along the lower edge and positioned directly below the lower edge relative to the axis. The gutter defines an airflow outlet from the housing radially inside the gutter relative to the axis. The sensor unit defines an airflow inlet radially inside the lower edge relative to the axis and positioned to receive airflow from the airflow outlet.

20 Claims, 8 Drawing Sheets

(56) References Cited

U.S. PATENT DOCUMENTS

| | | | |
|---|---|---|---|
| 10,761,190 B1 | 9/2020 | Sykula et al. | |
| 10,869,406 B1 | 12/2020 | Diehl et al. | |
| 10,900,723 B2* | 1/2021 | Hu | G01S 17/10 |
| 11,156,485 B1* | 10/2021 | Krishnan | B60R 11/00 |
| 2019/0331509 A1 | 10/2019 | Pizzimenti et al. | |
| 2021/0063093 A1* | 3/2021 | Tobiassen | G01S 17/88 |
| 2021/0088669 A1* | 3/2021 | Li | G01S 17/931 |
| 2021/0302541 A1* | 9/2021 | Fields | H05K 7/14 |
| 2021/0341584 A1* | 11/2021 | Ren | G01S 7/4813 |

* cited by examiner

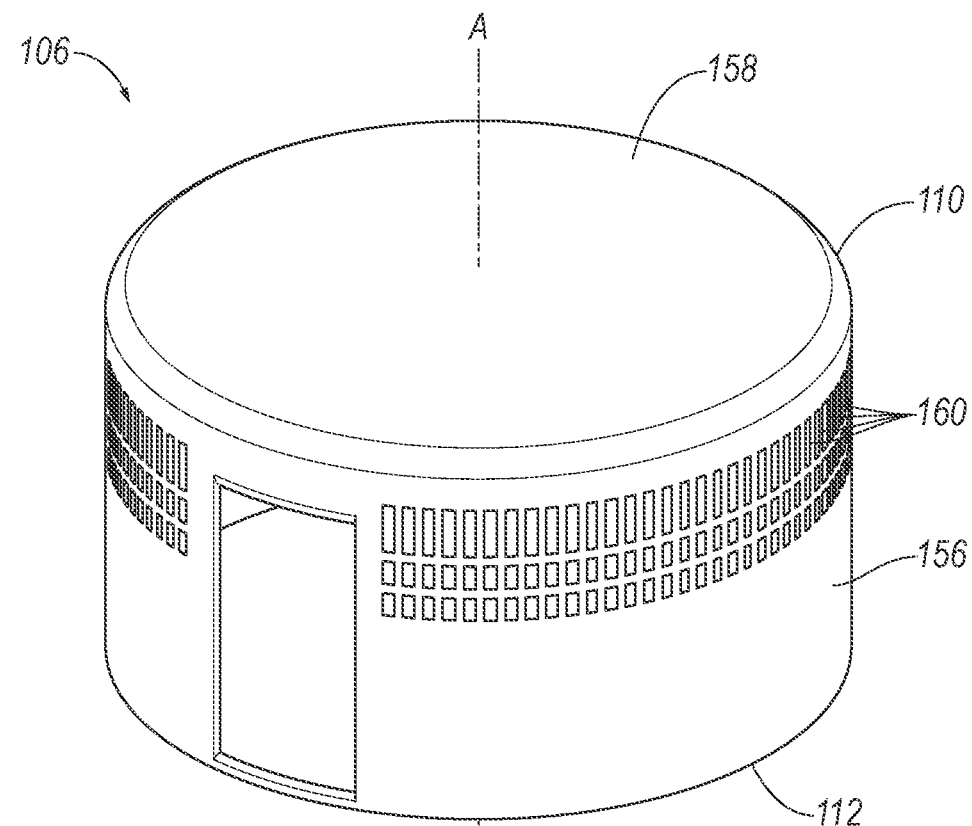
FIG. 6
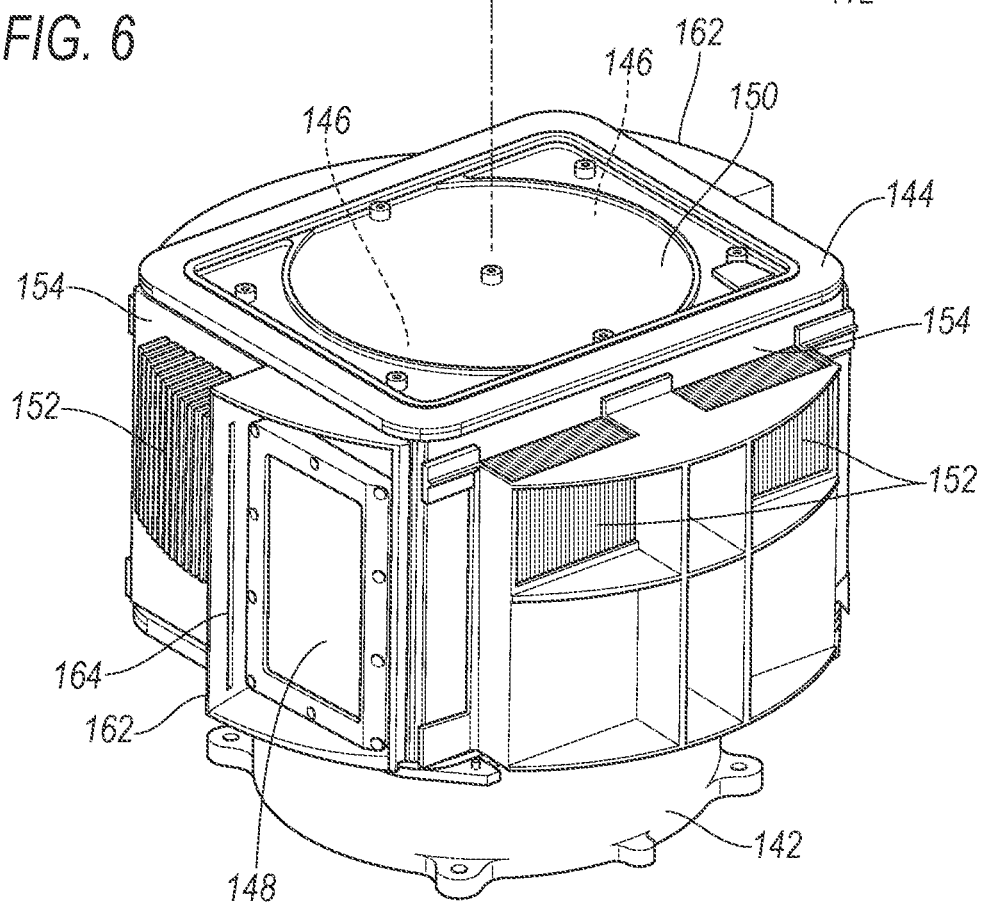

SENSOR ASSEMBLY

BACKGROUND

Vehicles can include a variety of sensors. Some sensors detect internal states of the vehicle, for example, wheel speed, wheel orientation, and engine and transmission values. Some sensors detect the position or orientation of the vehicle, for example, global positioning system (GPS) sensors; accelerometers such as piezo-electric or microelectromechanical systems (MEMS); gyroscopes such as rate, ring laser, or fiber-optic gyroscopes; inertial measurements units (IMU); and magnetometers. Some sensors detect the external world, for example, radar sensors, scanning laser range finders, light detection and ranging (LIDAR) devices, and image processing sensors such as cameras. A LIDAR device detects distances to objects by emitting laser pulses and measuring the time of flight for the pulse to travel to the object and back.

BRIEF DESCRIPTION OF THE DRAWINGS

FIG. 6 is an exploded perspective view of the sensor unit.

DETAILED DESCRIPTION

Figure 1:
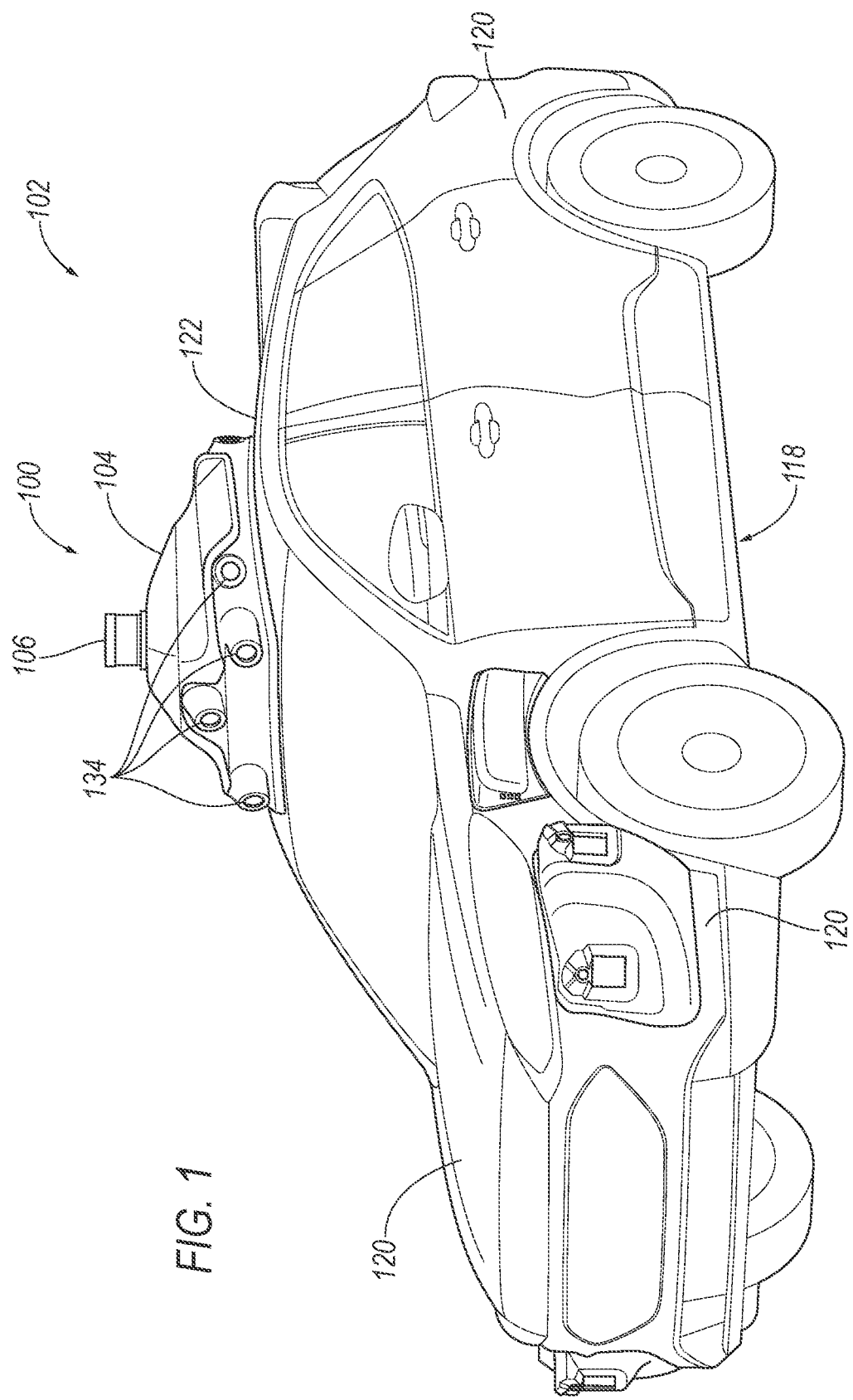
FIG. 1 is a perspective view of an example vehicle with an example sensor assembly.

A sensor assembly includes a housing, a sensor unit attached to the housing, and a gutter fixed relative to the housing. The sensor unit includes a cylindrical shell defining a vertical axis. The cylindrical shell extends above a highest point of the housing. The cylindrical shell is rotatable around the axis relative to the housing. The cylindrical shell includes a lower edge and extending upward along the axis from the lower edge. The gutter is elongated along the lower edge and positioned directly below the lower edge relative to the axis. The gutter defines an airflow outlet from the housing radially inside the gutter relative to the axis. The sensor unit defines an airflow inlet radially inside the lower edge relative to the axis and positioned to receive airflow from the airflow outlet.

The gutter may include a channel extending from radially inside the lower edge to radially outside the lower edge relative to the axis.

The sensor assembly may further include a bracket, the sensor unit may be fastened to the bracket, and the gutter may be fastened to the bracket. The bracket may include a circular base centered on the axis and a plurality of arms extending radially outward from the base relative to the axis, the sensor unit may be fastened to the base, and the gutter may be fastened to the arms. The arms may extend radially outward and axially upward from the base relative to the axis. The sensor assembly may further include a pressurized-air source positioned to discharge airflow between the arms and then through the airflow outlet.

The sensor assembly may further include a rigid structure positioned inside the housing, and the housing and the bracket may be mounted to the rigid structure.

The sensor unit may include a motor fixed relative to the bracket and drivably coupled to the cylindrical shell.

The sensor assembly may further include a pressurized-air source positioned to discharge airflow through the airflow outlet.

The housing may include an aperture, and the sensor unit extends through the aperture. The lower edge may be positioned radially inside and below the aperture relative to the axis.

The gutter may include a channel extending from radially outside to radially inside the aperture relative to the axis.

The housing may include a drain hole positioned to receive fluid from the gutter. The housing may include an upper surface, and the drain hole may extend from inside the housing to the upper surface.

The sensor unit may include a sensor window, and the sensor window may be recessed from the cylindrical shell. The sensor unit may include a passage positioned to direct airflow from the airflow inlet across the sensor window.

The sensor unit may include a sensor body positioned inside the cylindrical shell and fixed relative to the cylindrical shell, and the sensor body may include a plurality of fins extending radially outward relative to the axis from the sensor body toward the cylindrical shell. The fins may be positioned to receive airflow from the airflow inlet, and the fins are oriented parallel to the axis.

The cylindrical shell may include a plurality of slits elongated parallel to the axis, and the slits may be positioned to receive airflow from the airflow inlet.

The sensor unit may include a LIDAR sensing device.

With reference to the Figures, wherein like numerals indicate like parts throughout the several views, a sensor assembly 100 for a vehicle 102 includes a housing 104, a sensor unit 106 attached to the housing 104, and a gutter 108 fixed relative to the housing 104. The sensor unit 106 includes a cylindrical shell 110 defining a vertical axis A. The cylindrical shell 110 extends above a highest point of the housing 104. The cylindrical shell 110 is rotatable around the axis A relative to the housing 104. The cylindrical shell 110 includes a lower edge 112 and extends upward along the axis A from the lower edge 112. The gutter 108 is elongated along the lower edge 112 and positioned directly below the lower edge 112 relative to the axis A. The gutter 108 defines an airflow outlet 114 from the housing 104 radially inside the gutter 108 relative to the axis A. The sensor unit 106 defines an airflow inlet 116 radially inside the lower edge 112 relative to the axis A and positioned to receive airflow from the airflow outlet 114.

The sensor assembly 100 provides both cooling and water management for a rotating sensor unit 106 on a stationary housing 104. The airflow outlet 114 defined by the gutter 108 provides a path for airflow into the cylindrical shell 110, where the airflow can cool components of the sensor unit 106. Because the cylindrical shell 110 rotates at a high rate of speed relative to the housing 104, a gap is present between the cylindrical shell 110 and the housing 104. The position of the gutter 108 directly below and close to the lower edge 112 of the cylindrical shell 110 permits only a small amount of the airflow to escape through the gap between the gutter 108 and the lower edge 112, making the airflow from the housing 104 to the sensor unit 106 efficient despite the fact that the cylindrical shell 110 moves relative to the housing 104. Moreover, the position of the gutter 108 directly below the lower edge 112 of the cylindrical shell 110 provides a pathway for, e.g., rain or washer fluid to drain away from the sensor unit 106 without entering the housing 104.

With reference to FIG. 1, the vehicle 102 may be any suitable type of ground vehicle, e.g., a passenger or commercial automobile such as a sedan, a coupe, a truck, a sport utility, a crossover, a van, a minivan, a taxi, a bus, etc.

The vehicle 102 may be an autonomous vehicle. A computer can be programmed to operate the vehicle 102 independently of the intervention of a human driver, completely or to a lesser degree. The computer may be programmed to operate the propulsion, brake system, steering, and/or other vehicle systems based at least in part on data received from the sensor unit 106. For the purposes of this disclosure, autonomous operation means the computer controls the propulsion device, brake system, and steering system without input from a human driver; semi-autonomous operation means the computer controls one or two of the propulsion system, brake system, and steering system and a human driver controls the remainder; and nonautonomous operation means a human driver controls the propulsion system, brake system, and steering system.

The vehicle 102 may include a vehicle body 118. The vehicle body 118 includes body panels 120 partially defining an exterior of the vehicle 102. The body panels 120 may present a class-A surface, e.g., a finished surface exposed to view by a customer and free of unaesthetic blemishes and defects. The body panels 120 include, e.g., a roof 122, etc.

The sensor assembly 100 is attachable to one of the body panels 120 of the vehicle 102, e.g., the roof 122. For example, the housing 104 may be shaped to be attachable to the roof 122, e.g., may have a shape matching a contour of the roof 122. The housing 104 may be attached to the roof 122, which can provide the sensor unit 106 and other sensors 134 mounted inside the housing 104 with an unobstructed field of view of an area around the vehicle 102. The housing 104 may be formed of, e.g., plastic or metal.

Figure 2:
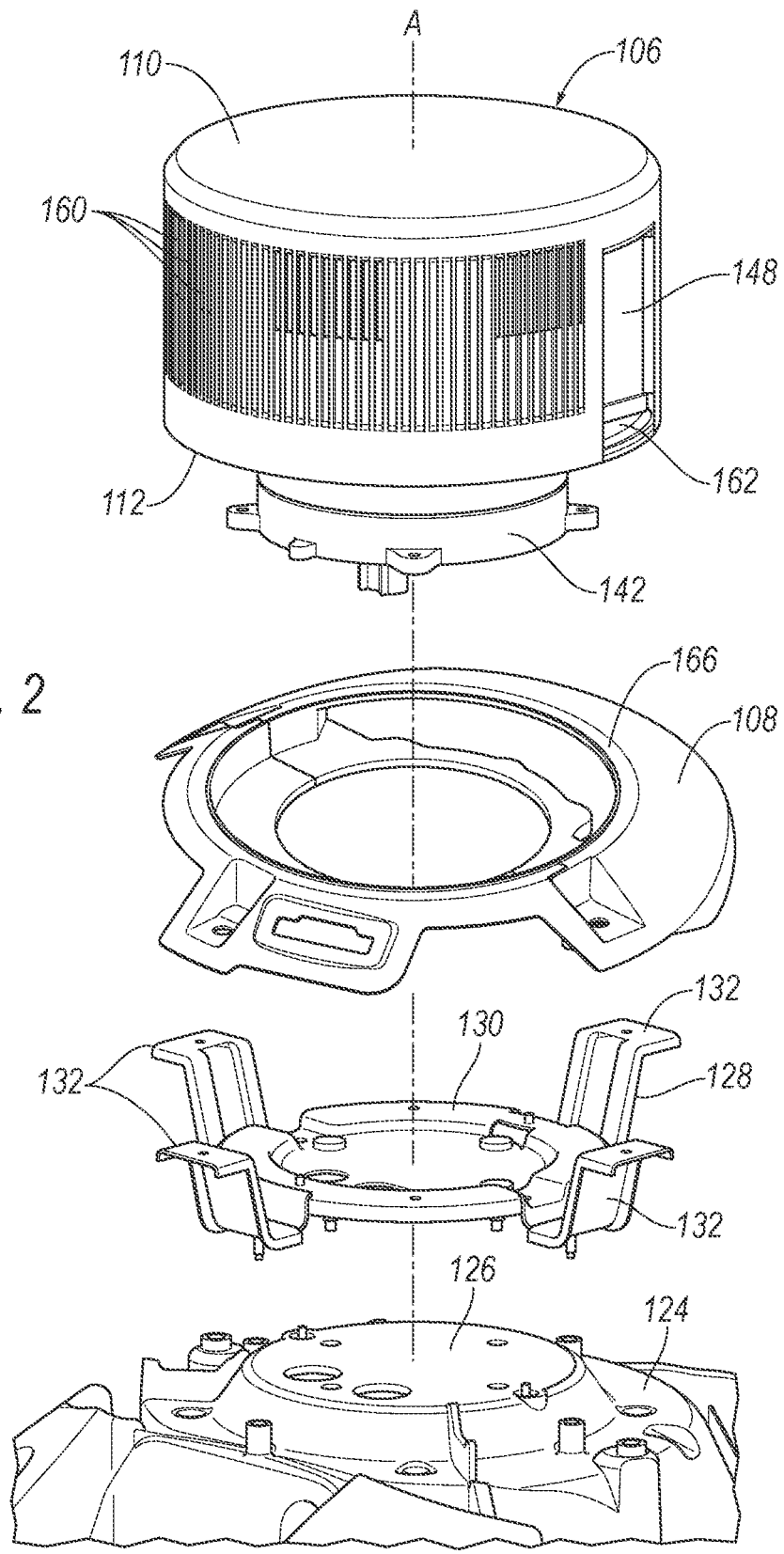
FIG. 2 is an exploded perspective view of a portion of the sensor assembly.
Figure 4:
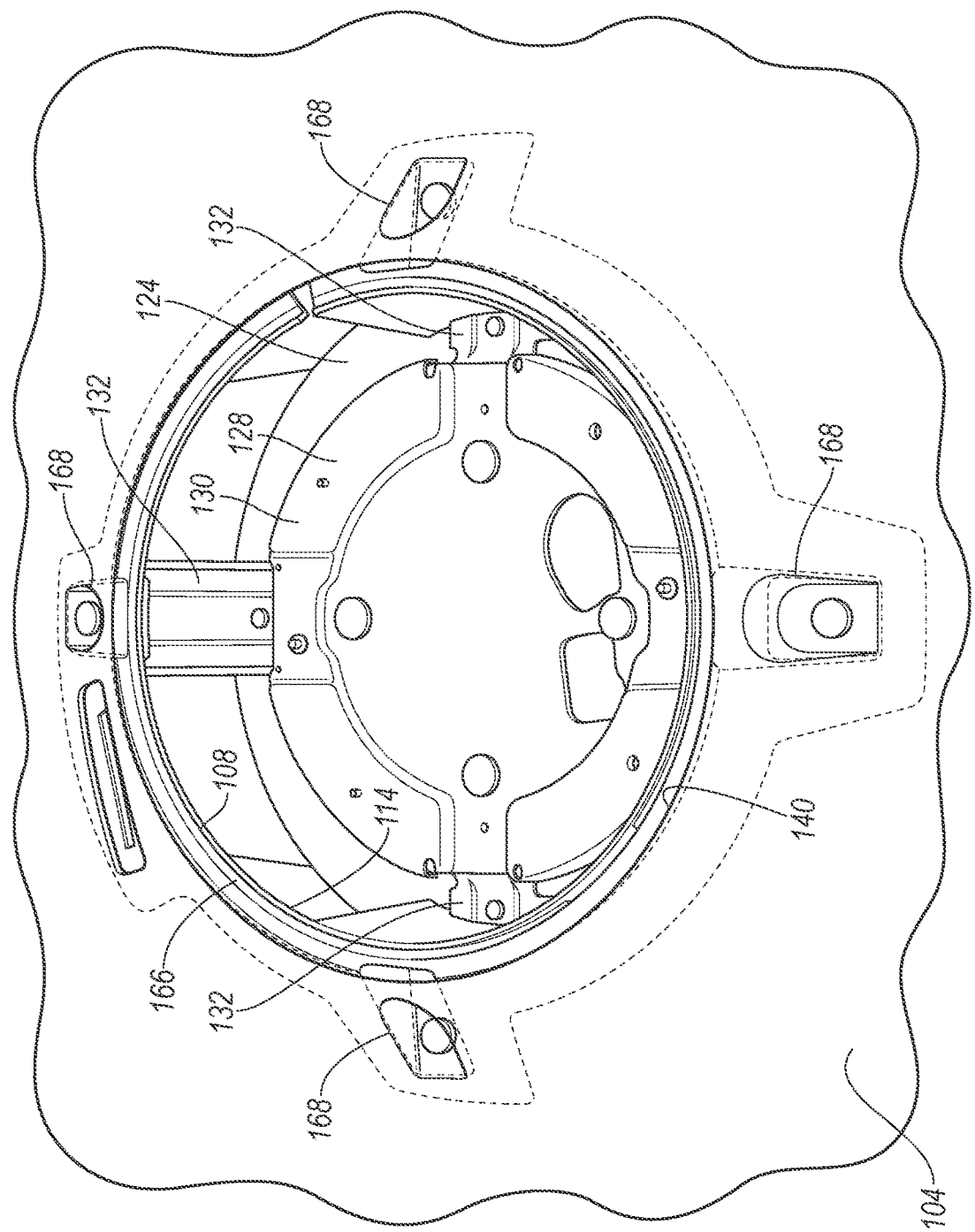
FIG. 4 is a perspective view of a portion of the sensor assembly with a sensor unit removed for illustration.

With reference to FIG. 2, the sensor assembly 100 includes a rigid structure 124. The housing 104 and the rigid structure 124 are shaped to fit together, with the rigid structure 124 positioned inside the housing 104, as seen in FIG. 4. The rigid structure 124 can have a shape matching the contour of the roof 122 like the housing 104 does. The rigid structure 124 can include a mounting platform 126 for directly or indirectly mounting a bracket 128, the gutter 108, and the sensor unit 106. The mounting platform 126 can be round, e.g., can have a circular or slightly elliptical shape, and can be centered on the axis A. The mounting platform 126 can be flat and horizontally level. The rigid structure 124 can be a single piece, i.e., a continuous piece of material with no internal seams separating multiple pieces. For example, the rigid structure 124 can be stamped or molded as a single piece.

The sensor assembly 100 includes a bracket 128 mounted to the rigid structure 124, e.g., fastened to the mounting platform 126. The sensor unit 106 can be mounted to the bracket 128, e.g., fastened through the bracket 128 to the mounting platform 126. The bracket 128 can be a single piece, i.e., a continuous piece of material with no internal seams separating multiple pieces. For example, the bracket 128 can be stamped or molded as a single piece.

The bracket 128 is shaped to accept and fix in place the sensor unit 106, e.g., via fastening. The bracket 128 defines an orientation and position of the sensor unit 106 relative to the body of the vehicle 102. The position of the sensor unit 106 affords the sensor unit 106 a 360° horizontal field of view of the environment surrounding the vehicle 102, as shown in FIG. 1. The bracket 128 can include a circular base 130 centered on the axis A and a plurality of arms 132 extending radially outward and axially upward from the base 130 relative to the axis A.

The sensor assembly 100 includes the gutter 108. The gutter 108 is fastened to the bracket 128, e.g., to the arms 132 of the bracket 128. The gutter 108 is fixed relative to the housing 104 via the bracket 128. The gutter 108 has a circular shape centered on the axis A. The shape of the gutter 108 is addressed in more detail below.

Figure 3:
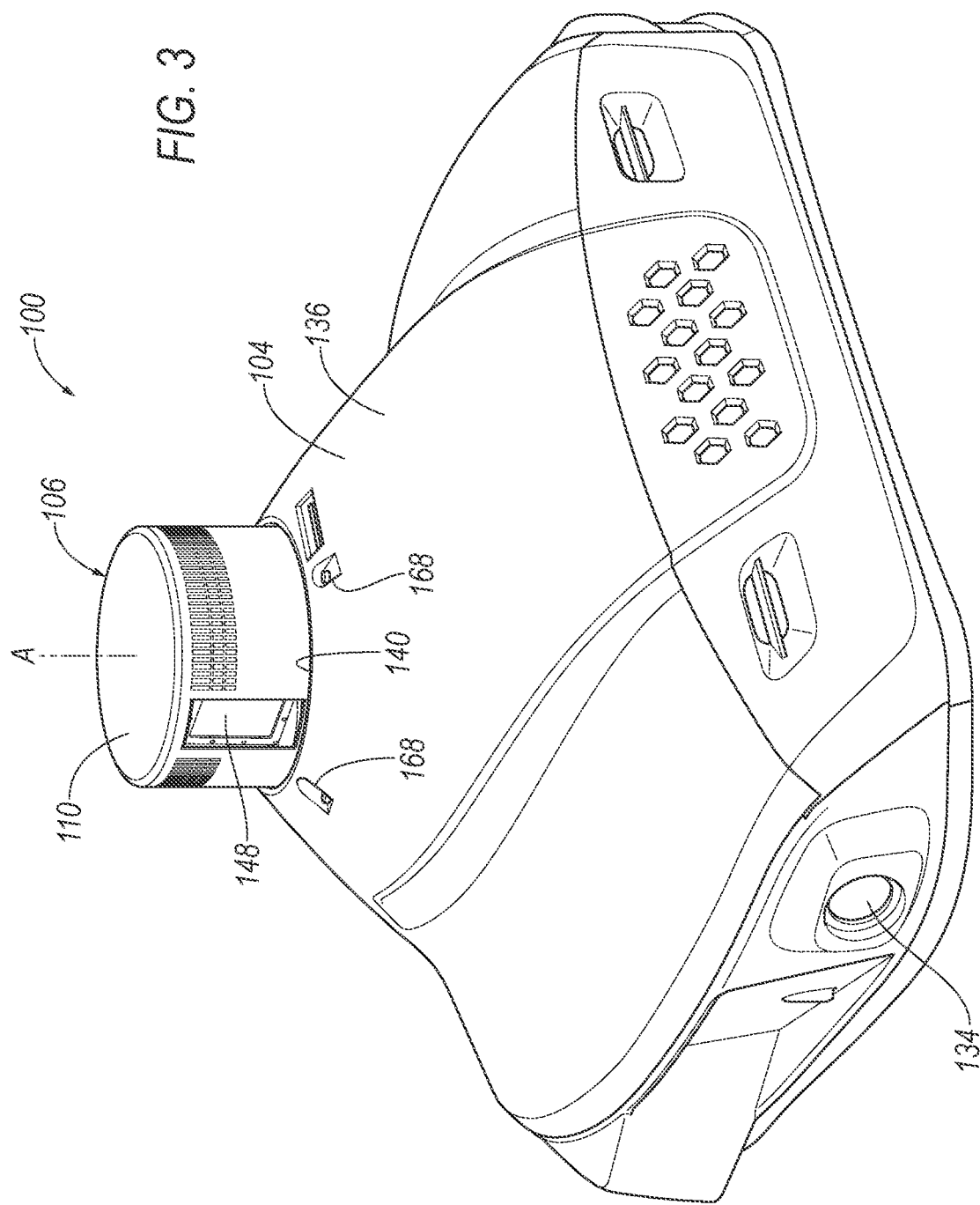
FIG. 3 is a rear perspective view of the sensor assembly.

With reference to FIG. 3, the housing 104 is mounted to the rigid structure 124 and covers the rigid structure 124. The housing 104 contains other sensors 134. The housing 104 includes an upper surface 136 facing away from the rigid structure 124, i.e., away from the body of the vehicle 102, and a lower surface 138 facing toward the rigid structure 124, i.e., toward the body of the vehicle 102 (shown in FIGS. 7 and 8). The housing 104 may be a single piece, i.e., a continuous piece of material with no internal seams separating multiple pieces. For example, the housing 104 may be stamped or molded as a single piece.

With reference to FIG. 4, the housing 104 includes an aperture 140 through which the sensor unit 106 passes. In the absence of the sensor unit 106 and the bracket 128, the aperture 140 exposes the rigid structure 124. The aperture 140 is round, e.g., has a circular or slightly elliptical shape. The aperture 140 is centered on the axis A.

Figure 5:
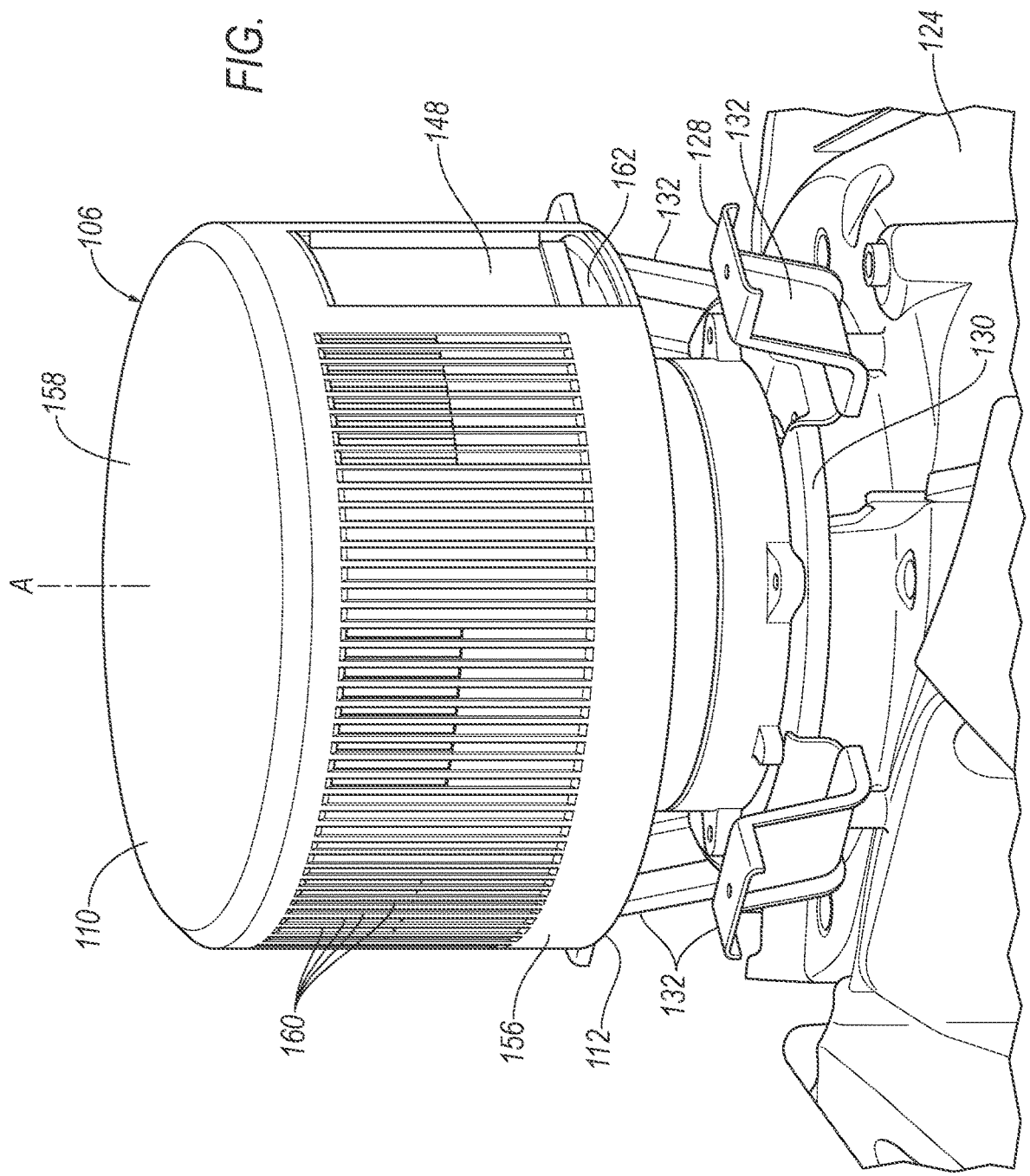
FIG. 5 is a perspective view of a portion of the sensor assembly with a housing and a gutter removed for illustration.

With reference to FIG. 5, the sensor unit 106 is attached, e.g., fastened, to the bracket 128, e.g., to the base 130 of the bracket 128. For example, the sensor unit 106 can be fastened to the rigid structure 124, e.g., through the base 130 of the bracket 128. The sensor unit 106 extends through the aperture 140, as seen in FIG. 3.

Returning to FIG. 2, the gutter 108 and the sensor unit 106 are both attached, e.g., fastened, to the bracket 128. The dimensional tolerancing of the sensor unit 106 relative to the gutter 108 is thereby improved. Specifically, the gap between the gutter 108 and the cylindrical shell 110 of the sensor unit 106 can be kept at an intended size more reliably, permitting the intended size to be smaller for less airflow escaping. The dimensional tolerancing can be further improved by the bracket 128 being a single piece, as well as by the gutter 108 and the sensor unit 106 directly contacting the bracket 128, i.e., being fastened without intermediate components.

With reference to FIG. 6, the sensor unit 106 includes a motor 142, a sensor body 144, at least one sensing device 146, at least one sensor window 148, and the cylindrical shell 110. The motor 142 is attached to and fixed relative to the bracket 128, as shown in FIG. 5. The sensor body 144, the at least one sensing device 146, the at least one sensor window 148, and the cylindrical shell 110 are fixed relative to each other and are rotatably drivably coupled to the motor 142.

The motor 142 is fixed relative to the bracket 128 and drivably coupled to the sensor body 144 and thereby drivably coupled to the cylindrical shell 110. The motor 142 can be any suitable type for rotating the sensing device 146, e.g., an electric motor. For example, the motor 142 can include a stator (not shown) fixed relative to the bracket 128 and a rotor (not shown) rotatable by the stator around the axis A and fixed relative to the sensor body 144.

The sensor body 144 includes walls 154, e.g., four vertical walls 154 as shown in the Figures, and a top panel 150. The walls 154 can have the same horizontal length, i.e., the walls 154 can form a square horizontal cross-section. The horizontal cross-section can be centered on the axis A, i.e., the axis A intersects a geometric center of the horizontal cross-section of the sensor body 144, making the rotation of the sensor body 144 balanced. The top panel 150 extends horizontally to each wall 154. The sensing device 146 is contained inside the sensor body 144. The sensor body 144 is positioned inside the cylindrical shell 110 and fixed relative to the cylindrical shell 110.

The sensor body 144 includes a plurality of fins 152. The fins 152 are positioned on the walls 154. The fins 152 are oriented parallel to the axis A, i.e., axially relative to the axis A, e.g., elongated vertically along the respective wall 154 for the axis A being vertical. The fins 152 can be positioned on all of the walls 154. The fins 152 on each wall 154 extend parallel to each other. The fins 152 can extend perpendicularly from the respective wall 154. Each fin 152 has a length following a direction of elongation of the fin 152 along the wall 154, a width perpendicular to the wall 154, and a thickness in a horizontal direction along the wall 154. The fins 152 extend along their respective widths radially outward relative to the axis A from the sensor body 144 toward the cylindrical shell 110. The length can be significantly greater than the width, e.g., more than twice as great. The width can be significantly greater than the thickness, e.g., more than five times as great. The fins 152 can be integral with the walls 154, i.e., made of a single, uniform piece of material with no seams, joints, fasteners, or adhesives holding it together.

The fins 152 are thermally conductive, i.e., have a high thermal conductivity, e.g., a thermal conductivity equal to at least 15 watts per meter-Kelvin (W/(m K)), e.g., greater than 100 W/(m K), at 25° C. For example, the fins 152, along with the walls 154, may be aluminum. The high thermal conductivity of the fins 152 helps transfer away heat generated by the sensing device 146 inside the sensor body 144, as does the large surface area created by the geometry of the fins 152.

The sensor unit 106 may be designed to detect features of the outside world; for example, the sensor unit 106 may be a radar sensor, a scanning laser range finder, a light detection and ranging (LIDAR) device, or an image processing sensor such as a camera. In particular, the sensor unit 106 may be a LIDAR device, e.g., a scanning LIDAR device. A LIDAR device detects distances to objects by emitting laser pulses at a particular wavelength and measuring the time of flight for the pulse to travel to the object and back. The operation of the sensor unit 106 is performed by the at least one sensing device 146, e.g., a LIDAR sensing device 146, inside the sensor body 144. For example, the sensor unit 106 can include two sensing devices 146. The sensing devices 146 have fields of view through the sensor windows 148 encompassing a region from which the sensor unit 106 receives input. As the sensing devices 146 rotate, the fields of view encompass a horizontal 360° around the vehicle 102.

The sensor unit 106 can include at least one sensor window 148, e.g., two sensor windows 148, one sensor window 148 for each sensing device 146. The sensor windows 148 are each positioned on one of the walls 154. Each sensor window 148 can be off-center on the respective wall 154. For example, the sensor window 148 can be positioned closer to a trailing edge of the respective wall 154 than a leading edge of the wall 154 with respect to a direction of rotation of the sensor body 144. For example, each sensor window 148 can be positioned in a trailing half of the respective wall 154 with respect to the direction of rotation. The sensor windows 148 can be flat. For example, the sensor windows 148 can have a rectangular shape. The sensor windows 148 are transparent with respect to whatever medium the sensing device 146 is capable of detecting. For example, if the sensor unit 106 is a LIDAR device, then the sensor windows 148 are transparent with respect to visible light at the wavelength generated and detectable by the sensing devices 146.

The cylindrical shell 110 is fixedly attached to the sensor body 144, e.g., fastened to the top panel 150 of the sensor body 144. The cylindrical shell 110 is rotatable around the axis A relative to the housing 104, along with the sensor body 144.

The cylindrical shell 110 includes a cylindrical portion 156 and an end portion 158. The end portion 158 is flat and has a circular shape. The end portion 158 is attached, e.g., fastened, to the top panel 150 of the sensor body 144. The cylindrical portion 156 has a cylindrical shape defining the axis A, which is vertical. The cylindrical portion 156 has a constant circular cross-section extending upward along the axis A from the lower edge 112 to the end portion 158. The cylindrical shell 110 is open at the lower edge 112, thereby permitting airflow into the sensor unit 106 and attachment of the sensor unit 106.

The cylindrical shell 110 includes a plurality of slits 160. The slits 160 extend through the cylindrical portion 156 and are elongated parallel to the axis A. The slits 160 can be positioned radially outward from the fins 152 and are elongated parallel to the fins 152. As described below, the slits 160 permit airflow into the cylindrical shell 110 to exit from the cylindrical shell 110.

The sensor windows 148 are recessed from the cylindrical shell 110. The sensor unit 106 includes window recesses 162 extending from the sensor window 148 and from the respective wall 154 radially outward to the cylindrical shell 110. The window recesses 162 include passages 164 positioned to direct airflow entering the cylindrical shell 110 across the sensor window 148. For example, the passages 164 can be positioned in the direction of rotation of the sensor body 144 from the respective sensor windows 148, i.e., as the sensor body 144 rotates, each passage 164 leads the respective sensor window 148. The passages 164 can extend vertically for a height of the respective sensor windows 148.

Figure 7:
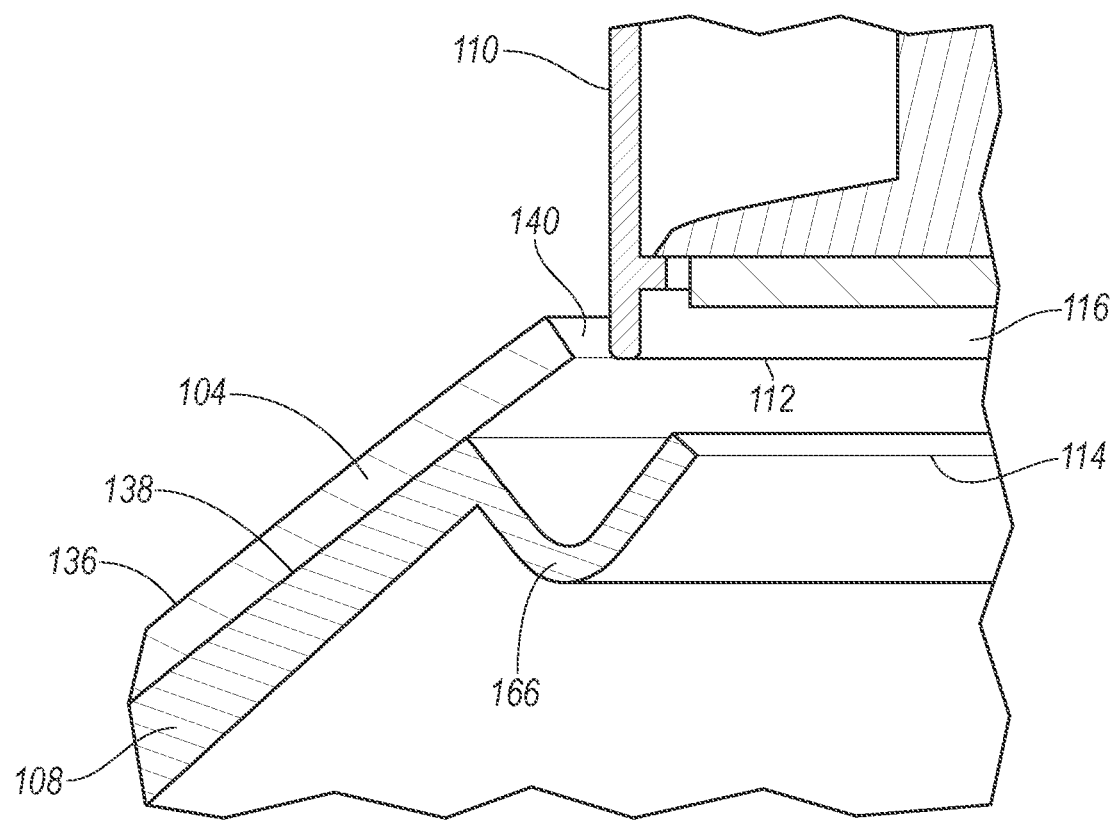
FIG. 7 is a perspective cross-sectional view of a portion of the sensor assembly.

With reference to FIG. 7, the aperture 140 of the housing 104 is a highest point of the housing 104. The lower edge 112 of the cylindrical shell 110 is positioned radially inside and below the aperture 140 relative to the axis A. The cylindrical shell 110 extends above the aperture 140, i.e., above the highest point of the housing 104. The lower edge 112 is positioned slightly below the aperture 140, and most of the cylindrical shell 110 is exposed above the housing 104. Positioning the lower edge 112 below the aperture 140 can reduce airflow escaping while flowing from the housing 104 to the cylindrical shell 110.

The gutter 108 is elongated along the lower edge 112 of the cylindrical shell 110. The gutter 108 is positioned directly below the lower edge 112 relative to the axis A, i.e., straight downward. The gutter 108 includes a channel 166. The channel 166 has a u- or v-shaped cross-section that follows the lower edge 112 of the cylindrical shell 110. The channel 166, specifically the cross-section of the channel 166, extends from radially inside the lower edge 112 to radially outside the lower edge 112 relative to the axis A, as well as from radially inside the aperture 140 to radially outside the aperture 140 relative to the axis A. A radially outer edge of the channel 166 can be flush against the lower surface 138 of the housing 104 at or radially outside of the aperture 140 relative to the axis A. The position and shape of the gutter 108 helps the gutter 108 catch fluid, e.g., rain or washer fluid, draining from an outside surface of the cylindrical portion 156 of the cylindrical shell 110.

Returning to FIGS. 3 and 4, the housing 104 includes at least one drain hole 168, e.g., four drain holes 168, positioned to receive fluid from the gutter 108. The drain holes 168 extend radially outward relative to the axis A from the gutter 108. The drain holes 168 extend from the lower surface 138 of the housing 104 at the gutter 108, i.e., from inside the housing 104, to the upper surface 136 of the housing 104, i.e., to outside the housing 104. Fluid can flow from the gutter 108 through the drain holes 168 and down the housing 104 toward the roof 122 of the vehicle 102.

Figure 8:
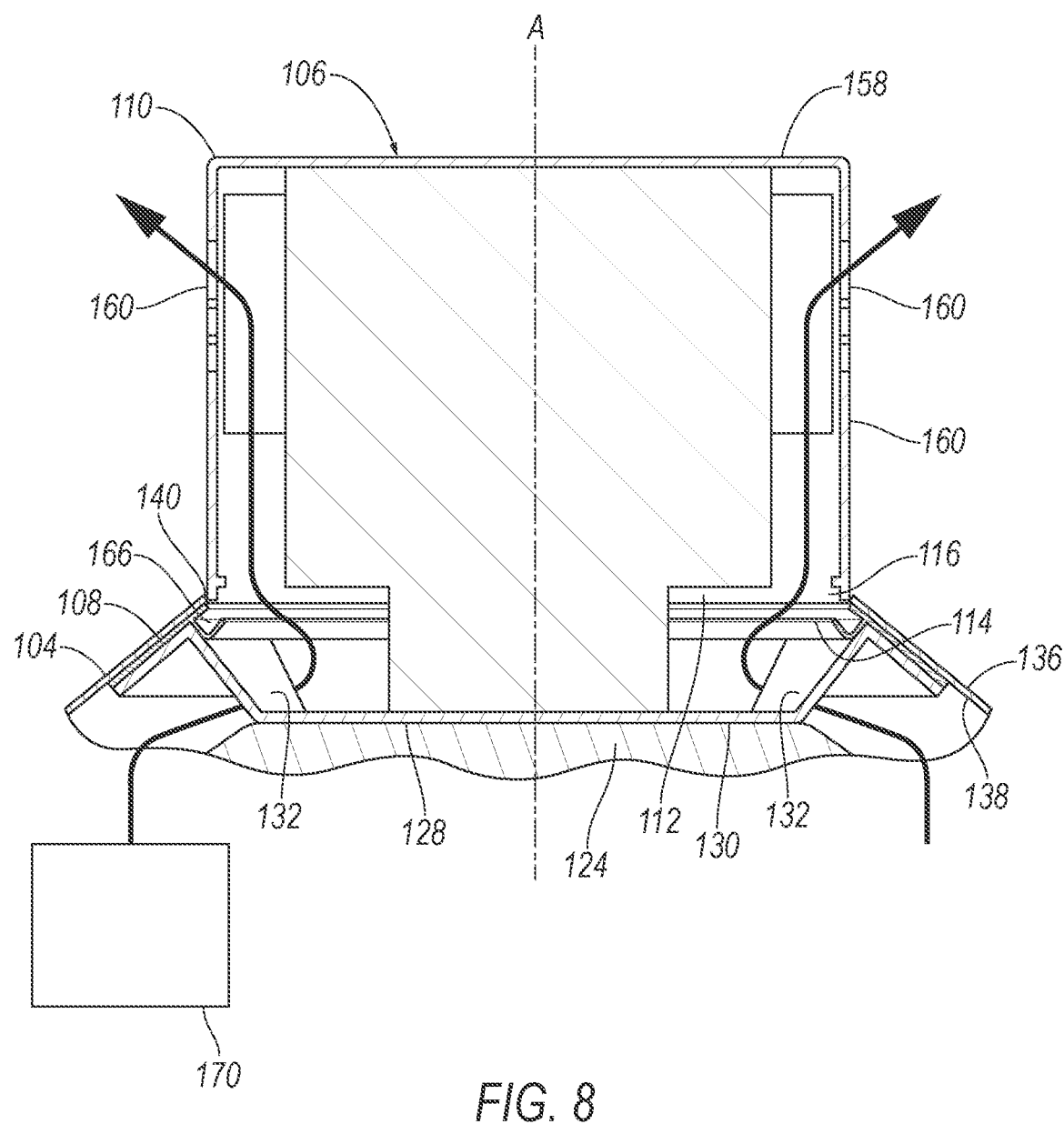
FIG. 8 is a diagrammatic side cross-sectional view of the sensor assembly.

With reference to FIG. 8, the sensor assembly 100 includes a pressurized-air source 170. The pressurized-air source 170 can be positioned inside the housing 104. The pressurized-air source 170 may be any suitable type of blower, e.g., a fan, or suitable type of compressor, e.g., a positive-displacement compressor such as a reciprocating, ionic liquid piston, rotary screw, rotary vane, rolling piston, scroll, or diaphragm compressor; a dynamic compressor such as an air bubble, centrifugal, diagonal, mixed-flow, or axial-flow compressor; or any other suitable type.

The pressurized-air source 170 is positioned to discharge airflow between the arms 132 of the bracket 128 and then through the airflow outlet 114. For example, the pressurized-air source 170 can be fluidly connected to a space between the rigid structure 124 and the housing 104 though which the pressurized air can flow to the bracket 128, then between the arms 132, then exiting through the airflow outlet 114. The gutter 108 defines the airflow outlet 114 passing radially inside the gutter 108 relative to the axis A, e.g., radially inside an inner edge of the channel 166. The airflow outlet 114 passes through the aperture 140.

The sensor unit 106 defines the airflow inlet 116 radially inside the lower edge 112 of the cylindrical shell 110 relative to the axis A. The airflow inlet 116 is positioned to receive airflow from the airflow outlet 114, e.g., the airflow inlet 116 encircles the airflow outlet 114, i.e., the lower edge 112 encircles the radially inner edge of the channel 166 of the gutter 108. The fins 152 and the slits 160 are positioned to receive airflow from the airflow inlet 116. For example, airflow that passes from the housing 104 through the airflow inlet 116 passes between the fins 152 and then exits the sensor unit 106 through the slits 160. The airflow thus transfers heat from the sensor body 144, thereby cooling the sensor body 144 and the sensing device 146. The airflow is vertical through the airflow inlet 116, and the vertical orientation of the fins 152 and the slits 160 facilitates smooth airflow.

The interface between the gutter 108 and the lower edge 112 of the cylindrical shell 110 provides for low levels of lost airflow from the housing 104 to the sensor unit 106. To escape, the airflow must pass through a small gap between the lower edge 112 and the gutter 108, and the airflow must follow a twisting path above the radially inner edge of the channel 166, below the lower edge 112 of the cylindrical shell 110, and above the aperture 140. This twisting path keeps losses low while permitting the cylindrical shell 110 to be spaced from the gutter 108 and the housing 104 so that the cylindrical shell 110 can rotate relative to the gutter 108 and the housing 104.

The disclosure has been described in an illustrative manner, and it is to be understood that the terminology which has been used is intended to be in the nature of words of description rather than of limitation. Many modifications and variations of the present disclosure are possible in light of the above teachings, and the disclosure may be practiced otherwise than as specifically described.

The invention claimed is:

1. A sensor assembly comprising:
   a housing;
   a sensor unit attached to the housing; and
   a gutter fixed relative to the housing;
   the sensor unit including a cylindrical shell defining a vertical axis;
   the cylindrical shell extending above a highest point of the housing;
   the cylindrical shell being rotatable around the axis relative to the housing;
   the cylindrical shell including a lower edge and extending upward along the axis from the lower edge;
   the gutter being elongated along the lower edge and positioned directly below the lower edge relative to the axis;
   the gutter defining an airflow outlet from the housing radially inside the gutter relative to the axis; and
   the sensor unit defining an airflow inlet radially inside the lower edge relative to the axis and positioned to receive airflow from the airflow outlet.

2. The sensor assembly of claim 1, wherein the gutter includes a channel extending from radially inside the lower edge to radially outside the lower edge relative to the axis.

3. The sensor assembly of claim 1, further comprising a bracket, the sensor unit being fastened to the bracket, and the gutter being fastened to the bracket.

4. The sensor assembly of claim 3, wherein the bracket includes a circular base centered on the axis and a plurality of arms extending radially outward from the base relative to the axis, the sensor unit is fastened to the base, and the gutter is fastened to the arms.

5. The sensor assembly of claim 4, wherein the arms extend radially outward and axially upward from the base relative to the axis.

6. The sensor assembly of claim 5, further comprising a pressurized-air source positioned to discharge airflow between the arms and then through the airflow outlet.

7. The sensor assembly of claim 3, further comprising a rigid structure positioned inside the housing, the housing and the bracket being mounted to the rigid structure.

8. The sensor assembly of claim 3, wherein the sensor unit includes a motor fixed relative to the bracket and drivably coupled to the cylindrical shell.

9. The sensor assembly of claim 1, further comprising a pressurized-air source positioned to discharge airflow through the airflow outlet.

10. The sensor assembly of claim 1, wherein the housing includes an aperture, and the sensor unit extends through the aperture.

11. The sensor assembly of claim 10, wherein the lower edge is positioned radially inside and below the aperture relative to the axis.

12. The sensor assembly of claim 10, wherein the gutter includes a channel extending from radially outside to radially inside the aperture relative to the axis.

13. The sensor assembly of claim 1, wherein the housing includes a drain hole positioned to receive fluid from the gutter.

14. The sensor assembly of claim 13, wherein the housing includes an upper surface, and the drain hole extends from inside the housing to the upper surface.

15. The sensor assembly of claim 1, wherein the sensor unit includes a sensor window, and the sensor window is recessed from the cylindrical shell.

16. The sensor assembly of claim 15, wherein the sensor unit includes a passage positioned to direct airflow from the airflow inlet across the sensor window.

17. The sensor assembly of claim 1, wherein the sensor unit includes a sensor body positioned inside the cylindrical shell and fixed relative to the cylindrical shell, and the sensor body includes a plurality of fins extending radially outward relative to the axis from the sensor body toward the cylindrical shell.

18. The sensor assembly of claim 17, wherein the fins are positioned to receive airflow from the airflow inlet, and the fins are oriented parallel to the axis.

19. The sensor assembly of claim 1, wherein the cylindrical shell includes a plurality of slits elongated parallel to the axis, and the slits are positioned to receive airflow from the airflow inlet.

20. The sensor assembly of claim 1, wherein the sensor unit includes a LIDAR sensing device.

* * * * *